(12) United States Patent
Obst

(10) Patent No.: US 8,757,364 B2
(45) Date of Patent: Jun. 24, 2014

(54) SUBSTRATE TREATMENT SYSTEM

(75) Inventor: Henrik Obst, Dresden (DE)

(73) Assignee: VON ARDENNE Anlagentechnik GmbH, Dresden (DE)

( * ) Notice: Subject to any disclaimer, the term of this patent is extended or adjusted under 35 U.S.C. 154(b) by 366 days.

(21) Appl. No.: 13/180,762

(22) Filed: Jul. 12, 2011

(65) Prior Publication Data
US 2012/0006648 A1 Jan. 12, 2012

(30) Foreign Application Priority Data

Jul. 12, 2010 (DE) .......................... 10 2010 031 252

(51) Int. Cl.
B65G 13/06 (2006.01)
(52) U.S. Cl.
USPC .............. 198/788; 193/37; 198/789; 198/950
(58) Field of Classification Search
USPC ......... 198/782, 783, 784, 788, 789, 950, 780; 193/37; 414/217
See application file for complete search history.

(56) References Cited

U.S. PATENT DOCUMENTS

| 1,725,740 A | | 8/1929 | Schulte | |
|---|---|---|---|---|
| 3,867,748 A | * | 2/1975 | Miller | 198/789 |
| 5,720,378 A | * | 2/1998 | Fasoli | 198/780 |
| 7,175,018 B2 | * | 2/2007 | Helgerson et al. | 198/788 |
| 2009/0022571 A1 | * | 1/2009 | Krupyshev et al. | 414/217 |
| 2009/0053016 A1 | * | 2/2009 | van der Meulen | 414/217 |

FOREIGN PATENT DOCUMENTS

| DE | 3215921 A1 | 11/1983 |
|---|---|---|
| DE | 102005016406 A1 | 10/2006 |
| DE | 102007052524 A1 | 5/2009 |
| JP | 62230513 A | 10/1987 |
| JP | 2003028265 A | 1/2003 |
| JP | 2006237161 A | 9/2006 |
| JP | 2007127214 A | 5/2007 |

OTHER PUBLICATIONS

Office Action issued in corresponding Japanese application No. 2011-152688 mailed on Feb. 12, 2013.
National Examination Report issued in corresponding German application No. 10 2010 031 252.5 dated Mar. 26, 2013.

* cited by examiner

Primary Examiner — Leslie A Nicholson, III
(74) Attorney, Agent, or Firm — Heslin Rothenberg Farley & Mesiti P.C.

(57) ABSTRACT

A substrate treatment system for treating substrates in a continuous process includes a system chamber delimited by chamber walls, having an entry lock and an exit lock, and also at least one substrate treatment device and a transportation device inside the system chamber. The transportation device has an arrangement of transportation rollers arranged one behind the other in the transportation direction, for vertical or horizontal transportation of substrates. The rotor of the drive device is arranged under the pressure conditions prevailing in the system chamber and the stator of the drive device is arranged outside the pressure conditions prevailing in the system chamber.

9 Claims, 6 Drawing Sheets

SUBSTRATE TREATMENT SYSTEM

CROSS-REFERENCE TO RELATED APPLICATIONS

Figure 1:
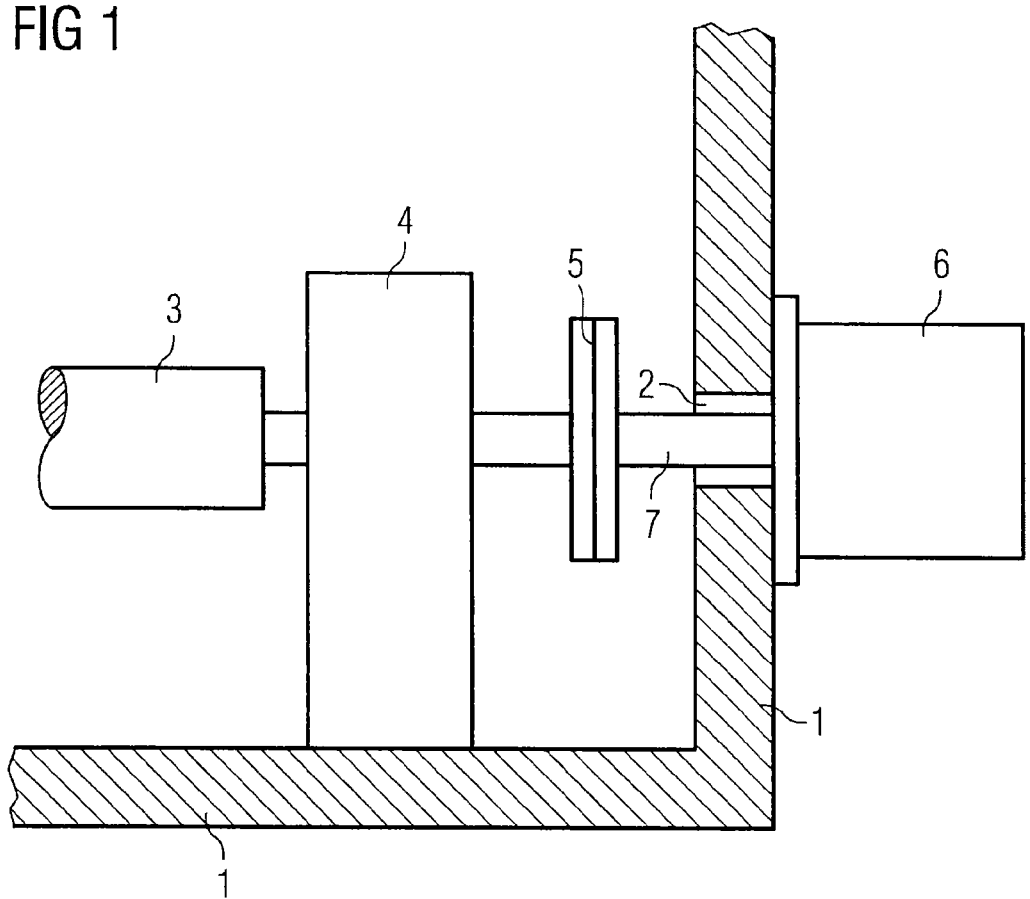

This application is related to commonly assigned, concurrently filed application Ser. No. 13/180,944 and claims priority of German application no. 10 2010 031 252.5-22 filed on Jul. 12, 2010, the entire contents of these applications being hereby incorporated by reference herein.

BACKGROUND ART

The invention relates to a substrate treatment system having a transportation device for transporting substrates.

Typical substrate treatment systems for carrying out substrate treatment operations in a continuous process comprise an elongate system chamber having an entry lock at one end and an exit lock at the other end and also functional regions which are arranged between the said locks, for example one or more treatment regions with in each case at least one substrate treatment device, for example a coating device, an etching device, a heating device or the like, one or more pump regions with in each case at least one pump for evacuation or/and for atmospheric separation between functional regions situated upstream and downstream of the said pump, transfer regions for transferring the substrates from one functional region to the next functional region etc.

In this case, the functional regions which are defined by their function can form physically independent containers, which are connected to one another to form a system chamber, or can be arranged inside a common container which forms the system chamber. In the latter case, the functional regions can be physically bounded from one another by separating walls which typically have a substrate passage which can be designed as a flow resistor, that is to say as an opening of a size which still just permits the passage of the substrates, or as a valve, for example a check valve, roll valve or slider valve.

In substrate treatment systems of this kind, for example systems for coating or/and for dry-etching plate-like substrates, transportation devices are known, these transportation devices having an arrangement of transportation wheels or transportation rolls on which the substrates are transported in the transportation direction, in a vertical or horizontal position, from the entry lock to the exit lock through the substrate treatment system and, in the process, through the functional regions arranged between the said locks. In this case, the substrates can be supported by a substrate holder which is moved by the transportation device or can be moved through the substrate treatment system without a substrate holder, that is to say directly on the transportation device in a horizontal or vertical position.

In this case, a transportation roll is to be understood to mean an elongate, substantially cylindrical body which is rotatably mounted, for example in a typical transportation device for the horizontal (recumbent) transportation of plate-like substrates, at each of the two ends of the said transportation device, it being possible for a plurality of transportation rolls to be mounted, for example by way of each end, in a respective bearing support, the bearing supports in each case having the bearings for a plurality of transportation rolls which are arranged one behind the other in the transportation direction of the substrates. A transportation device of this kind is described, for example, in DE 10 2005 016 406 A1.

In contrast, for the purposes of this description, a transportation wheel is intended to be understood to mean a relatively short, substantially cylindrical body (with or without circumferential guide channels) which is rotatably mounted, for example in a typical transportation device for the vertical (upright or slightly inclined from the vertical) transportation of plate-like substrates, at only one of the two ends of the said transportation device. A plurality of transportation wheels can also be mounted, for example by way of one end, in a bearing support, the bearing supports in each case having the bearings for a plurality of transportation wheels which are arranged one behind the other in the transportation direction of the substrates. As an alternative, the bearings can also be arranged in a chamber wall of the substrate treatment system. A transportation device of this kind is described, for example, in DE 10 2007 052 524 A1.

For reasons of linguistic simplicity, transportation rolls and transportation wheels of the above-described type will both be referred to as transportation rollers in the text which follows.

In known transportation devices, the transportation rollers are actively driven, that is to say a drive device, for example an electric motor, is provided, this drive device driving a plurality of transportation rollers which are coupled by mechanical transmission means, for example chains, toothed belts, vertical shafts or the like. The transportation rollers can be coupled to one another inside or outside the system chamber.

If the transmission means is located, and therefore the transportation rollers are coupled, outside the system chamber, the drive device can be arranged outside the system chamber, this being advantageous for substrate treatment operations under vacuum or at high temperatures. However, the drive torque for generating rotation of the transportation rollers has to be transmitted by rotary leadthroughs from outside to inside the system chamber in this case. Coupling of the transportation rollers outside the system chamber requires a respective rotary leadthrough for each individual transportation roller, this being reflected in the price of the substrate treatment system. At the same time, a large number of potential leakage points are produced, these having to be carefully sealed off.

If the transmission means is located, and therefore the transportation rollers are coupled, inside the system chamber, problems arise in respect of component and material selection and the installation site, especially in the case of hot processes or critical necessary gas separation. The known transmission means are subject to mechanical wear. Furthermore, the length of the transmission means changes as temperatures change and there is a risk of the process atmosphere being contaminated by the transmission means.

Proceeding from this prior art, an aspect of the present invention is to improve known continuous substrate treatment systems.

This aspect is achieved by a substrate treatment system having the features of the present invention. Refinements and developments are disclosed in the following description.

BRIEF SUMMARY OF THE INVENTION

In the case of a substrate treatment system for treating substrates, for example in a continuous process, which comprises a system chamber, which is delimited by chamber walls and can have an entry lock and an exit lock, and also at least a substrate treatment device and a transportation device inside the system chamber, the transportation device having an arrangement of transportation rollers, which are arranged one behind the other in the transportation direction, for the vertical or horizontal transportation of substrates, it is proposed that the rotor of the drive device is arranged under the pressure conditions prevailing in the system chamber and the stator is arranged outside the pressure conditions prevailing in the system chamber. In the simplest case, the rotor is arranged inside the system chamber, the stator is arranged outside the system chamber, and the rotor is driven by induction through a chamber wall.

The drive device can act on a single transportation roller which transmits its rotation to other transportation rollers by known transmission means, or the drive device acts on a drive wheel which drives a plurality of transportation rollers by a transmission means of this kind. As an alternative, the drive device can act solely on a single transportation roller, as will be explained in even greater detail below.

According to one refinement, provision may be made, for example, for the drive device to have a separating element which hermetically separates the rotor and the stator of the drive device from one another and which is connected to a chamber wall of the system chamber in a gas-tight manner. As a result, no shaft seals are required; there is no risk of leakage. In this case, the separating element can be connected to the chamber wall in a cohesive manner, for example by welding, or can be flange-connected to and sealed off from the chamber wall in a force-fitting manner, for example by means of screw connections, or can be mounted in some other way.

In the process, the separating element can extend outwards or inwards from the chamber wall, that is to say the separating element forms a projection or recess in the chamber wall, depending on the design of the chamber wall. The separating element can also be designed in one plane, for example parallel to the chamber wall.

In the case of a projection, the rotor is arranged at least partially in the interior of the projection, and the stator is arranged on the outside of the projection. The separating element is advantageously produced from a non-magnetic material. The stator, which is arranged on the outside of the projection, generates an alternating electromagnetic field which drives the rotor which is arranged in the projection. In this case, the rotor can be, for example, of bell-like design.

In the case of a recess, the stator is arranged at least partially in the interior of the recess and the rotor is arranged on the outside of the recess. In this case, the recess can additionally be designed such that it has an indentation which the rotor at least partially enters. For example, the rotor can be designed as a disc which is mounted on the transportation roller. A disc-like rotor of this kind can also have teeth or/and openings over its circumference. If the recess has an indentation which the rotor enters, the rotor will be surrounded by the stator in this region.

According to a further refinement, it is provided that, at least in the case of a first group of transportation rollers which are arranged immediately one behind the other, each transportation roller of this group has its own drive device of the above-described type. It goes without saying that provision can also be made for all the transportation rollers of the transportation device to each have their own drive device.

According to a further refinement, the drive devices of the first group of transportation rollers can be actuated separately from the drive device or devices of a second group of transportation rollers. For this purpose, it is sufficient for all the drive devices of the first group to be able to be actuated together.

As an alternative or in addition, provision may be made for the drive devices of the first group of transportation rollers to be able to be actuated individually. As a result, it is possible to determine the speed of each individual transportation roller. In this way, the rollers which are connected by a substrate which is to be transported can in each case be actuated with a common speed profile, while other rollers of the same field can be actuated with different speed profiles, as a result of which, for example, the distance between substrates in the transportation direction can be changed. In this case, the partial quantity of rollers which are connected by a substrate changes continuously during the transportation process.

BRIEF DESCRIPTION OF THE DRAWING FIGURES

Figure 2:
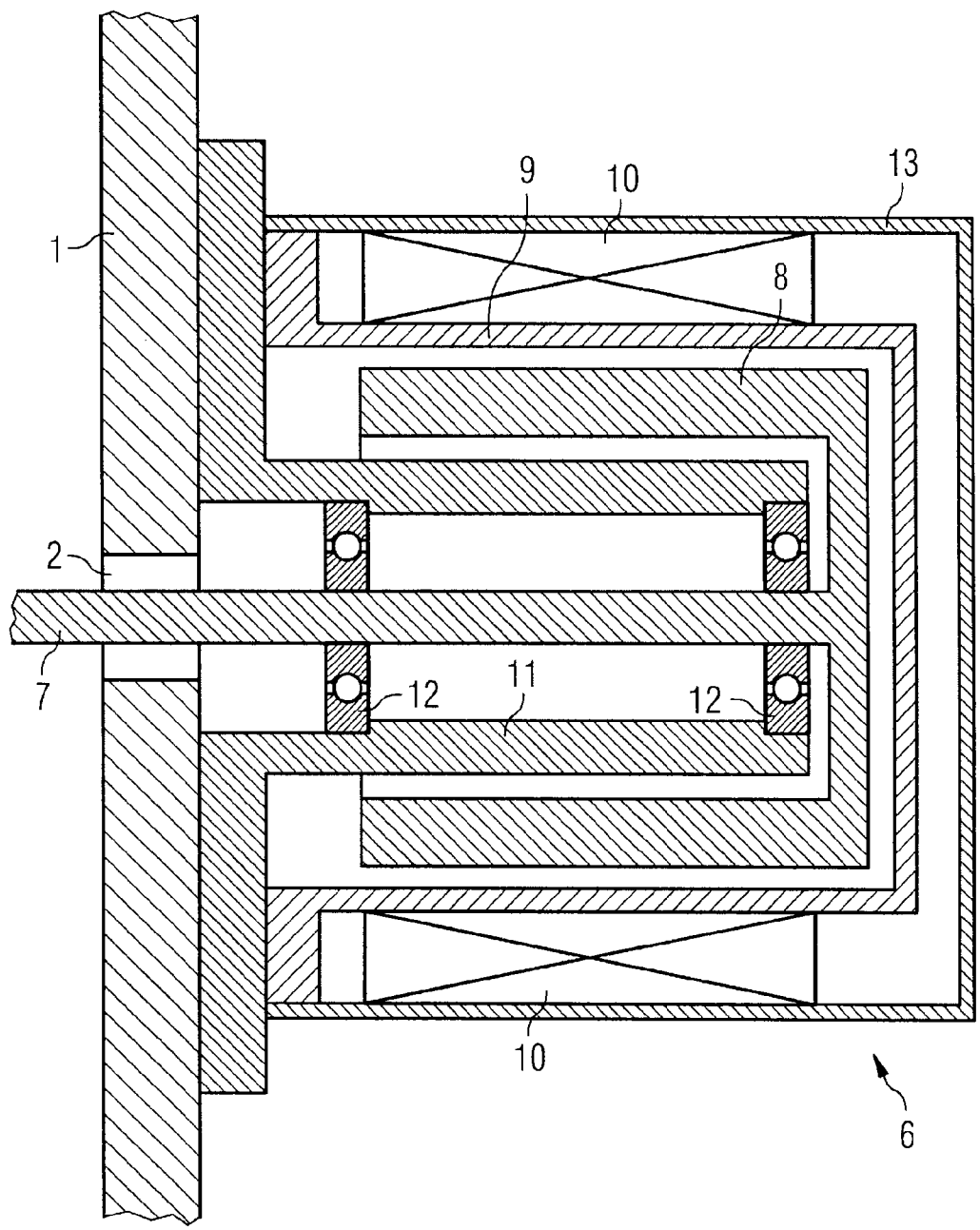
Figure 3:
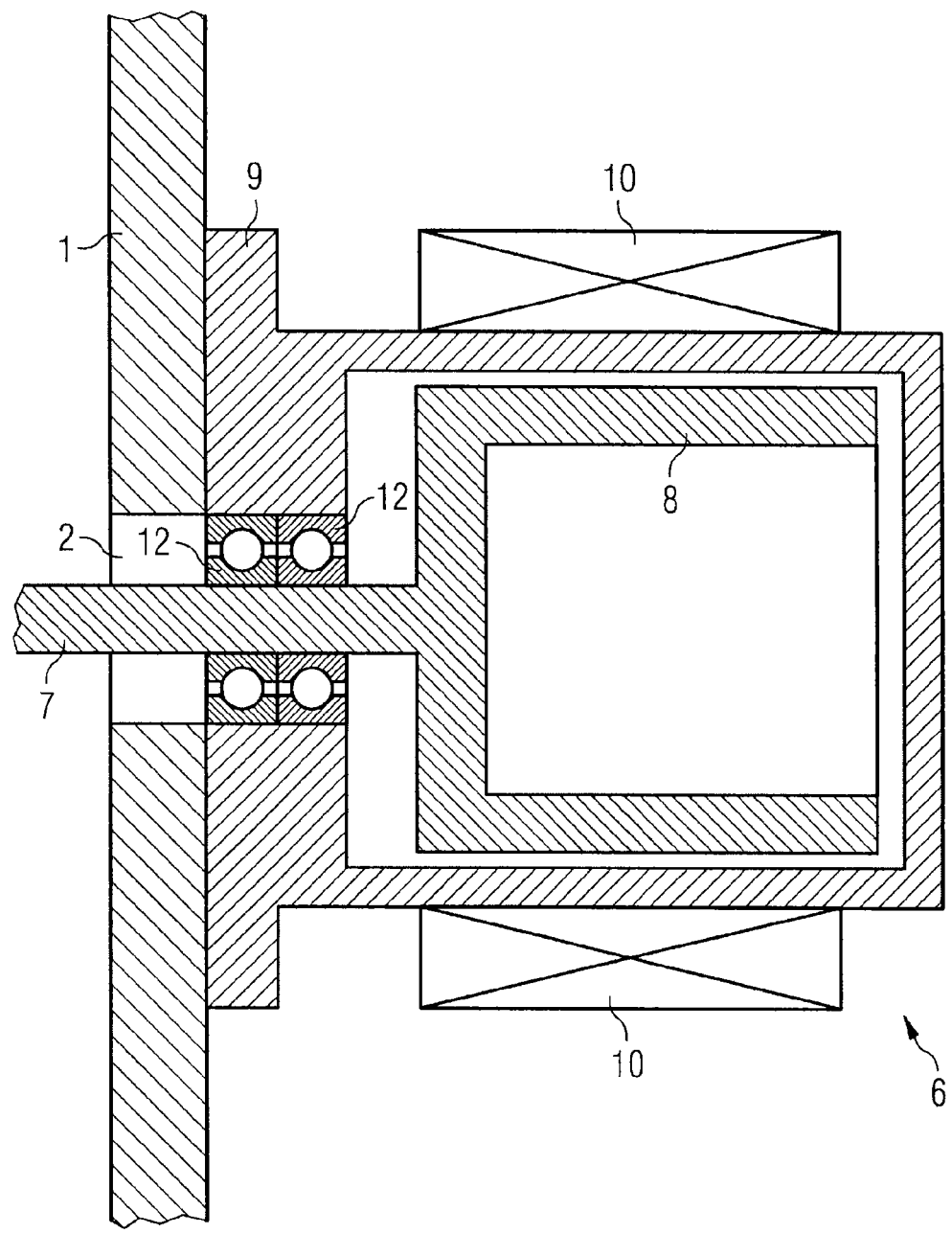
Figure 4:
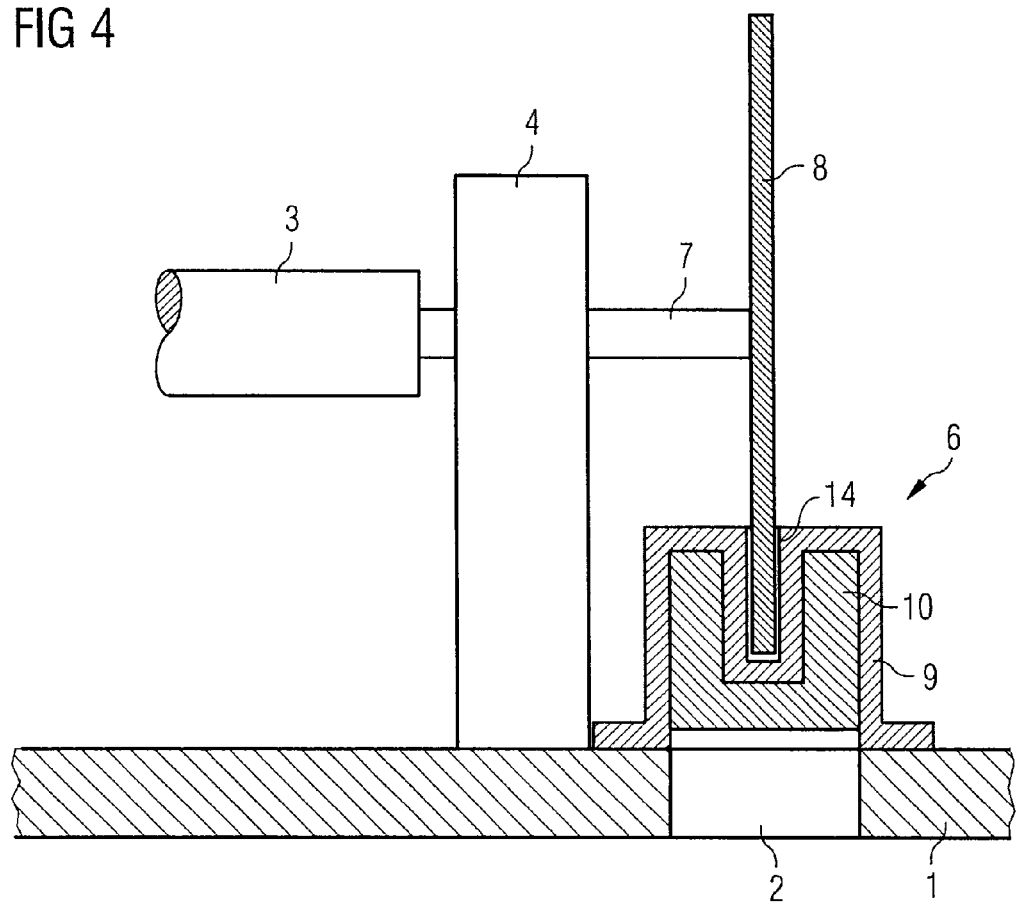
Figure 5:
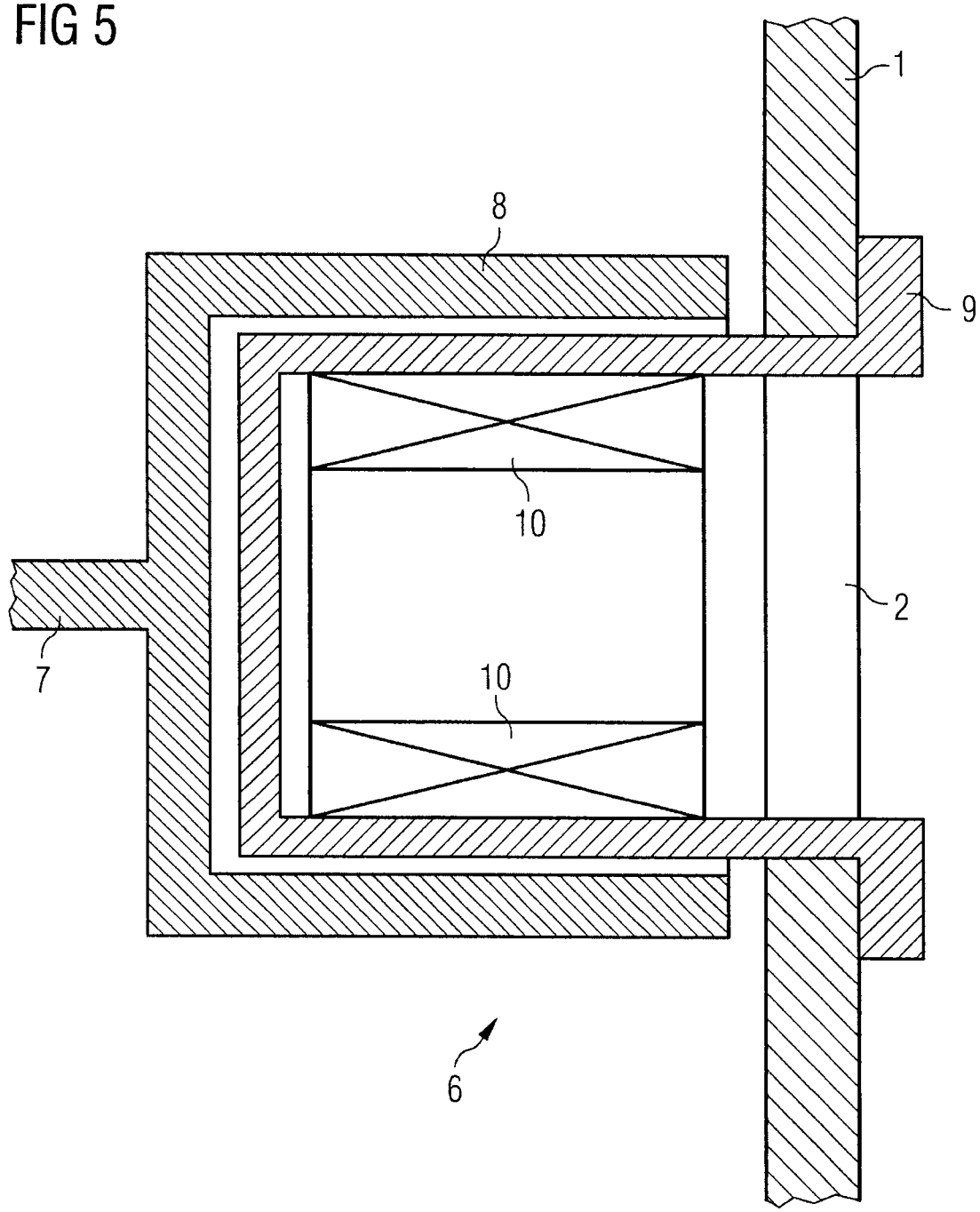
Figure 6:
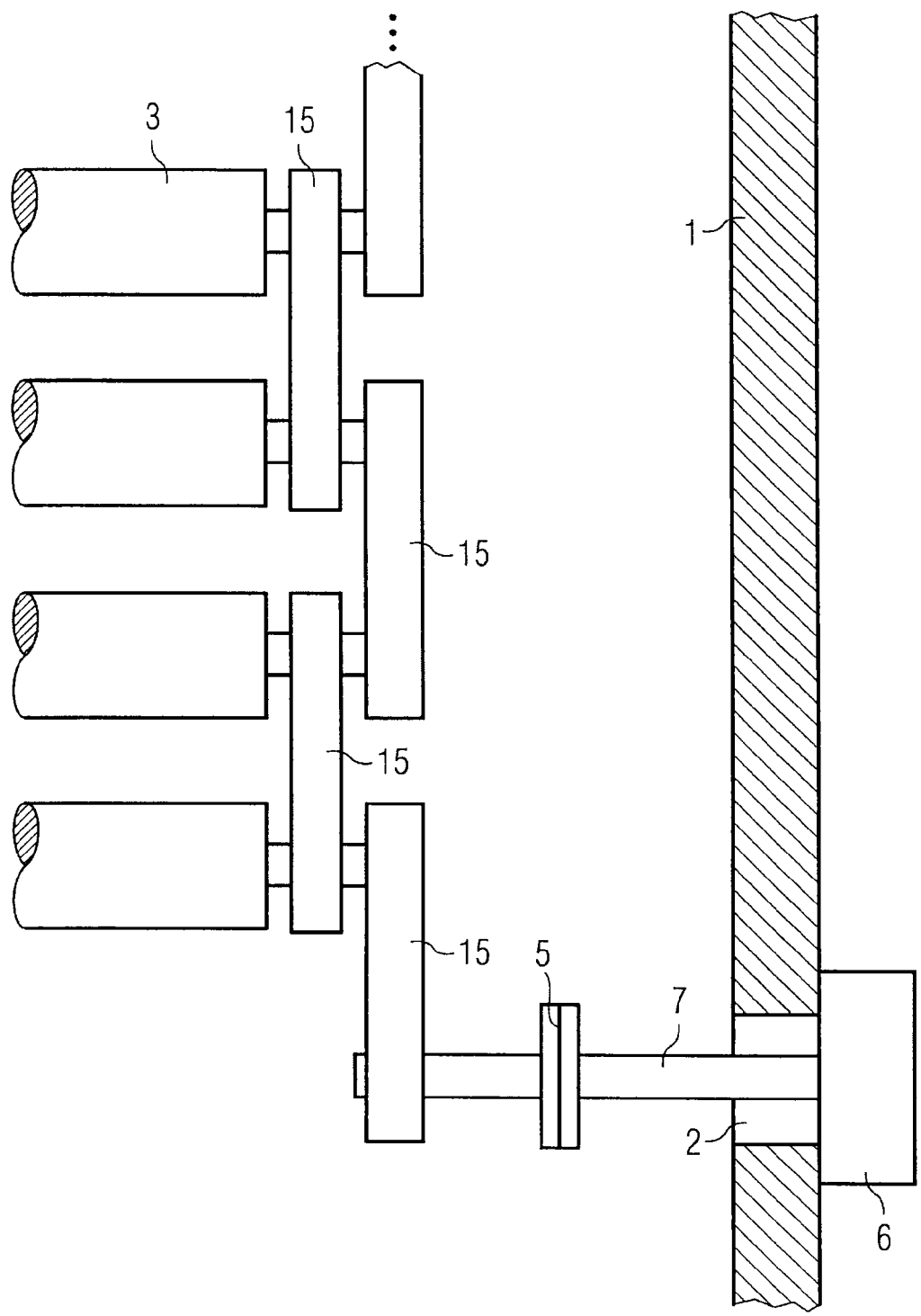

The substrate treatment system will be described in greater detail below with reference to exemplary embodiments and associated drawings, in which FIG. 1 shows a first exemplary embodiment for directly driving a transportation roller, FIG. 2 shows a first exemplary embodiment of a drive device according to FIG. 1, FIG. 3 shows a second exemplary embodiment of a drive device according to FIG. 1, FIG. 4 shows a second exemplary embodiment for directly driving a transportation roller, with a third exemplary embodiment of a drive device, FIG. 5 shows a fourth exemplary embodiment of a drive device, and FIG. 6 shows a third exemplary embodiment for driving a plurality of transportation rollers by a common drive device.

DETAILED DESCRIPTION

All the exemplary embodiments relate to substrate treatment systems for treating substrates in a continuous process, said substrate treatment systems having a system chamber, which is delimited by chamber walls 1 and has an entry lock and an exit lock, and also at least a substrate treatment device and a transportation device inside the system chamber, the transportation device having an arrangement of transportation rollers 3, which are arranged one behind the other in the transportation direction, for the vertical or horizontal transportation of substrates, in which a plurality of transportation rollers 3, which are arranged immediately one behind the other, each have their own drive device 6. The figures are highly schematic and are intended only to illustrate how the drive devices 6 are each operatively connected to a transportation roller 3. It goes without saying that the described drive devices 6 are suitable, in the same way, for substrate treatment systems in which a plurality of transportation rollers 3 are connected to a common drive device 6 by one or more transmission means 15 and are driven by the said drive device. An exemplary embodiment of this is illustrated in FIG. 6.

FIG. 1 illustrates a transportation device in which roll-like transportation rollers 3 are each rotatably mounted in a transportation roller bearing 4. A rotor shaft 7 which extends outwards through an opening 2 in the chamber wall 1 is fixed to the end of the transportation roller 3 by means of a clutch 5. A drive device 6 is fixed to the outside of the chamber wall 1.

FIG. 2 illustrates a first exemplary embodiment of the drive device 6.

Two rotor bearings 12 are arranged in a bearing housing 11, the rotor shaft 7 which projects through the opening 2 in the chamber wall 1 being rotatably mounted in the rotor bearings. The actual rotor 8, which is of bell-like design, is situated at the end of the rotor shaft 7. The rotor 8 is enclosed by a separating element 9 which is likewise of bell-like design. The bearing housing 11, the rotor 8 and the separating element 9 each have an annular cross section.

The stator, more precisely the stator windings 10 which generate an electromagnetic field during operation of the drive device, is arranged on the outside of the separating element 9. The separating element 9, together with the stator windings 10, forms the stator because the separating element 9 receives the reaction torque and passes it to the chamber wall 1. It goes without saying that it would likewise be possible to firmly connect the stator windings 10 to the outer housing 13, so that the stator windings 10 and the outer housing 13 form the stator.

The separating element 9 extends outwards from the chamber wall 1, that is to say it forms a projection on the chamber wall 1. The separating element 9 is connected to the chamber wall 1 in a gas-tight manner by means of the bearing housing 11 and hermetically separates the rotor 8 from the stator 10, so that the rotor 8 of the drive device 6 is arranged under the pressure conditions prevailing in the system chamber and the stator 10 is arranged outside the pressure conditions prevailing in the system chamber.

FIG. 3 illustrates a second exemplary embodiment of the drive device 6.

Two rotor bearings 12 are arranged in a separating element 9, the rotor shaft 7 being rotatably mounted in the said rotor bearings and projecting through the opening 2 in the chamber wall 1. The actual rotor 8, which is of bell-like design, is situated at the end of the rotor shaft 7. The rotor 8 is enclosed by a separating element 9 which is likewise of bell-like design. The bearing housing 11, the rotor 8 and the separating element 9 each have an annular cross section.

The stator, more precisely the stator windings 10 which generate an electromagnetic field during operation of the drive device, is arranged on the outside of the separating element 9. The separating element 9, together with the stator windings 10, forms the stator because the separating element 9 receives the reaction torque and passes it to the chamber wall 1.

The separating element 9 extends outwards from the chamber wall 1, that is to say it forms a projection on the chamber wall 1. The separating element 9 is connected to the chamber wall 1 in a gas-tight manner and hermetically separates the rotor 8 from the stator 10, so that the rotor 8 of the drive device 6 is arranged under the pressure conditions prevailing in the system chamber and the stator 10 is arranged outside the pressure conditions prevailing in the system chamber.

FIG. 4 illustrates a transportation device in which roll-like transportation rollers 3 are each rotatably mounted in a transportation roller bearing 4. A rotor shaft 7 is fixed to the end of the transportation roller 3, a disc-like rotor 8 being arranged at the end of the said rotor shaft.

A separating element 9 which forms a recess, that is to say projects into the system chamber, is fixed to the inside of the chamber wall 1. The stator windings 10 are arranged in the interior of the separating element 9. The separating element 9 and the stator windings 10 have an indentation 14 which the lower section of the rotor 8 enters, so that this section is surrounded by the stator windings 10.

FIG. 5 illustrates a fourth exemplary embodiment of the drive device 6, in which the separating element 9 likewise forms a recess.

However, in this case, the separating element 9 is again—as in the exemplary embodiments of FIGS. 1 to 3—arranged in the axial extent of the transportation roller 3. The separating element 9 is of bell-like design. It is mounted on the outside of the chamber wall 1 in a gas-tight manner and projects into the system chamber through the opening 2 in the chamber wall 1. A rotor 8, which is once again in the form of a bell and surrounds the separating element 9, is arranged at the end of the rotor shaft 7. The stator windings 10 are arranged in the interior of the separating element 9, so that the rotor 8 of the drive device 6 is arranged under the pressure conditions prevailing in the system chamber and the stator 10 is arranged outside the pressure conditions prevailing in the system chamber.

The invention claimed is:

1. Substrate treatment system for treating substrates, comprising a system chamber delimited by chamber walls, at least one substrate treatment device, and a transportation device inside the system chamber, the transportation device having an arrangement of transportation rollers arranged one behind an other in a transportation direction, for vertical or horizontal transportation of substrates, and at least one drive device, wherein a rotor of the drive device is arranged under pressure conditions prevailing in the system chamber and has a bell-like form with an annular cross-section extending from an end of a rotor shaft, and a stator of the drive device is arranged outside the pressure conditions prevailing in the system chamber.

2. The substrate treatment system according to claim 1, wherein the drive device has a non-magnetic separating element hermetically separating the rotor and the stator of the drive device from one another, and the separating element is connected to a chamber wall of the system chamber in a gas-tight manner.

3. The substrate treatment system according to claim 2, wherein the separating element extends outwards from the chamber wall forming a projection, the rotor is arranged at least partially in an interior of the projection, and the stator is arranged outside the projection.

4. The substrate treatment system according to claim 2, wherein the separating element extends inwards from the chamber wall forming a recess, and the stator is arranged at least partially in the recess.

5. The substrate treatment system according to claim 1, wherein at least a first group of the transportation rollers arranged immediately one behind an other each has a respective drive device.

6. The substrate treatment system according to claim 5, wherein the drive devices of the first group of transportation rollers are actuated separately from a drive device or drive devices of a second group of the transportation rollers.

7. The substrate treatment system according to claim 5, wherein the drive devices of the first group of transportation rollers are actuated individually.

8. Substrate treatment system for treating substrates, comprising a system chamber delimited by chamber walls, at least one substrate treatment device, and a transportation device inside the system chamber, the transportation device having an arrangement of transportation rollers arranged one behind an other in a transportation direction, for vertical or horizontal transportation of substrates, and at least one drive device, wherein a rotor of the drive device is arranged under pressure conditions prevailing in the system chamber and comprises a disc at the end of a rotor shaft, and a stator of the drive device is arranged outside the pressure conditions prevailing in the system chamber.

9. The substrate treatment system according to claim 8, wherein the drive device has a non-magnetic separating element hermetically separating the rotor and the stator of the drive device from one another, and the separating element is connected to a chamber wall of the system chamber in a gas-tight manner, wherein the separating element extends inwards from the chamber wall forming a recess, wherein the stator is arranged at least partially in the recess, and wherein the separating element has an indentation which the rotor at least partially enters.

\* \* \* \* \*